US011002761B2

(12) United States Patent
Genkin et al.

(10) Patent No.: US 11,002,761 B2
(45) Date of Patent: May 11, 2021

(54) PROBE CARD SYSTEM FOR TESTING AN INTEGRATED CIRCUIT

(71) Applicant: Keithley Instruments, LLC, Solon, OH (US)

(72) Inventors: Vladimir V. Genkin, Westfield Center, OH (US); Alexander N. Pronin, Twinsburg, OH (US); Joseph A. Peters, Cuyahoga Falls, OH (US)

(73) Assignee: Keithley Instruments, LLC, Solon, OH (US)

( * ) Notice: Subject to any disclaimer, the term of this patent is extended or adjusted under 35 U.S.C. 154(b) by 489 days.

(21) Appl. No.: 15/681,308

(22) Filed: Aug. 18, 2017

(65) Prior Publication Data
US 2019/0033343 A1 Jan. 31, 2019

Related U.S. Application Data

(60) Provisional application No. 62/536,853, filed on Jul. 25, 2017.

(51) Int. Cl.
*G01R 1/067* (2006.01)
*G01R 1/04* (2006.01)
(Continued)

(52) U.S. Cl.
CPC ......... *G01R 1/0675* (2013.01); *G01R 1/0491* (2013.01); *G01R 1/06716* (2013.01); *G01R 1/07314* (2013.01); *G01R 31/26* (2013.01)

(58) Field of Classification Search
CPC .. G01R 1/0675; G01R 1/07314; G01R 31/26; G01R 31/2831; G01R 31/2886; G01R 31/2891

(Continued)

(56) References Cited

U.S. PATENT DOCUMENTS 4,719,417 A * 1/1988 Evans ................. G01R 1/073
324/72.5
6,064,215 A * 5/2000 Kister ............... G01R 31/2886
324/756.03

(Continued)

OTHER PUBLICATIONS

Rainer Gaggl, "Under Pressure"—from High Voltage to MEMS Pressure Sensors Wafer Probing, IEEE SW Test Workshop—Semiconductor Wafer Test Workshop, Jun. 8-11, 2008, 16 pages, San Diego, CA, available at http://www.swtest.org/swtw_library/2008proc/PDF/S04_02_Gaggl_SWTW2008.pdf.

*Primary Examiner* — Farhana A Hoque
*Assistant Examiner* — Courtney G McDonnough
(74) *Attorney, Agent, or Firm* — Miller Nash Graham & Dunn; Andrew J. Harrington

(57) ABSTRACT

A system for testing an integrated-circuit wafer, the system including a probe card having a probe needle and a probe body enclosing a pressure chamber. The probe body includes a unitary sidewall, a first end cap substantially closing a first end of the probe body, except for an outlet passage in the first end cap, and an inlet passage configured to introduce compressed gas into the pressure chamber. The probe needle is within the pressure chamber and is supported by the probe body. A free end of the probe needle extends through the outlet passage. The ends of the probe needle are separated by a first bend in the probe needle, which has a center of curvature that is located between the probe needle and a longitudinal centerline of the unitary sidewall. Methods of using a probe card are also disclosed.

22 Claims, 6 Drawing Sheets

(51) Int. Cl.
*G01R 1/073* (2006.01)
*G01R 31/26* (2020.01)

(58) Field of Classification Search
USPC .... 324/755.1, 750.16, 750.03, 750.2, 755.04
See application file for complete search history.

(56) References Cited

U.S. PATENT DOCUMENTS

| | | | |
|---|---|---|---|
| 2007/0247177 A1* | 10/2007 | Ruckenbauer | G01R 31/2891 324/750.19 |
| 2011/0309850 A1* | 12/2011 | Yoshida | G01R 31/129 324/750.14 |
| 2014/0002118 A1* | 1/2014 | Gaggl | G01R 31/2642 324/750.01 |
| 2016/0069951 A1* | 3/2016 | Yamada | G01R 31/2891 324/750.2 |
| 2017/0299629 A1* | 10/2017 | Tsai | G01R 1/06777 |
| 2017/0367204 A1* | 12/2017 | Sekimori | G01L 19/145 |

* cited by examiner

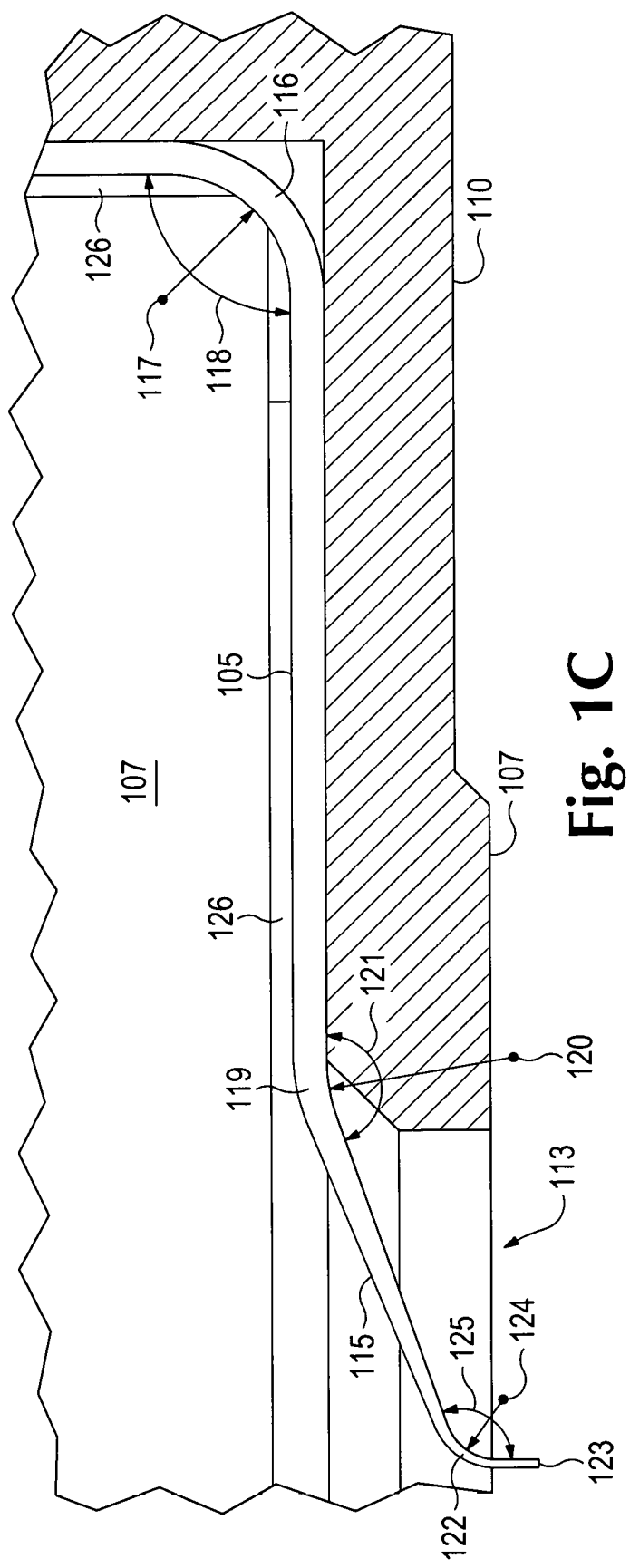

PROBE CARD SYSTEM FOR TESTING AN INTEGRATED CIRCUIT

FIELD OF THE INVENTION

This disclosure is directed to a system and methods for testing integrated-circuit wafers with a probe card.

BACKGROUND

During fabrication of a semiconductor device, electronic circuits are created on a semiconductor wafer, and the wafer is then diced into individual chips. Before dicing, the integrated circuits are generally subjected to electrical tests to determine if the circuits function properly. Typically, the wafer is mounted, such as by vacuum mounting, to a wafer chuck of a machine called a wafer prober. The wafer is brought into contact with one or more probe needles of a probe card. In this way, an electrical connection is made between contact pads on the wafer and the tips of the probe needles, allowing the integrated circuit to be tested for proper electrical function.

Due to the small distances and high voltages that might exist during the electrical tests of a semiconductor wafer, dielectric breakdown may be a problem. Some existing probe cards utilize Paschen's law to suppress the dielectric breakdown with pressure.

Embodiments of the disclosed technology address shortcomings in the prior art.

BRIEF DESCRIPTION OF THE DRAWINGS

FIG. 1C is a detail view of a portion of the probe card of FIG. 1B.

Figure 1A:
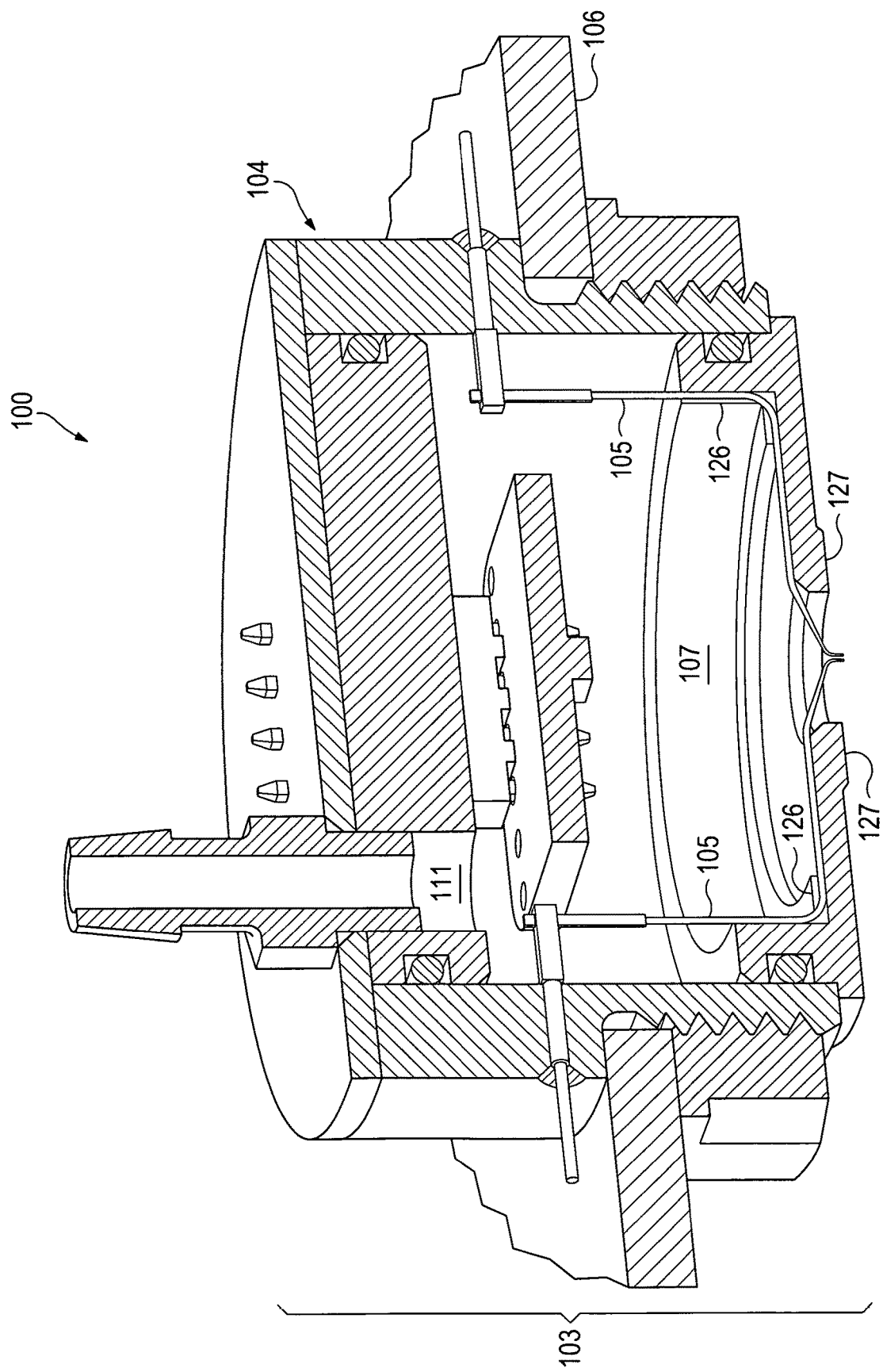
FIG. 1A is a sectional, perspective view of a probe card, according to embodiments.
Figure 1B:
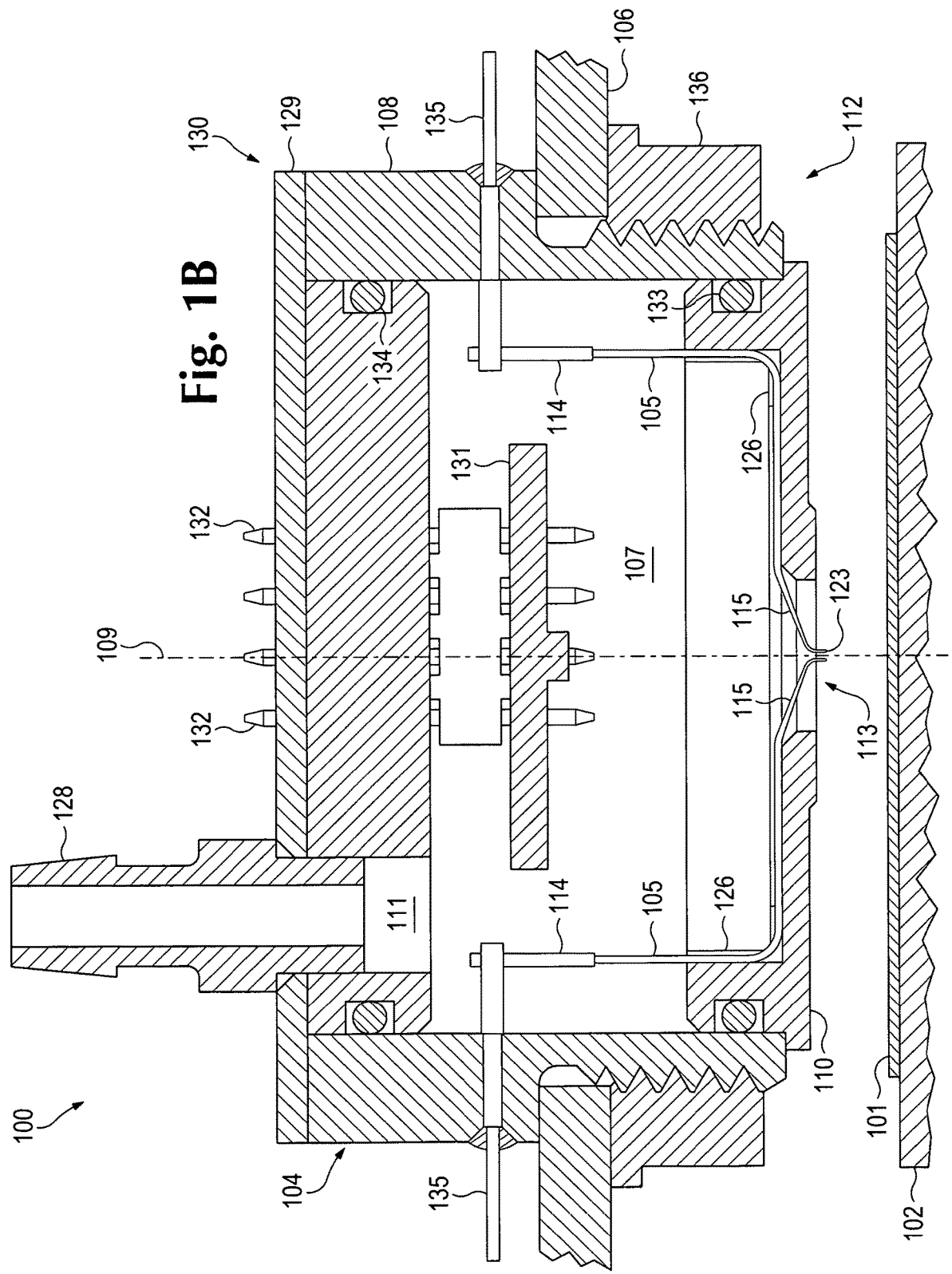
FIG. 1B is a front view of the probe card of FIG. 1A.
Figure 2:
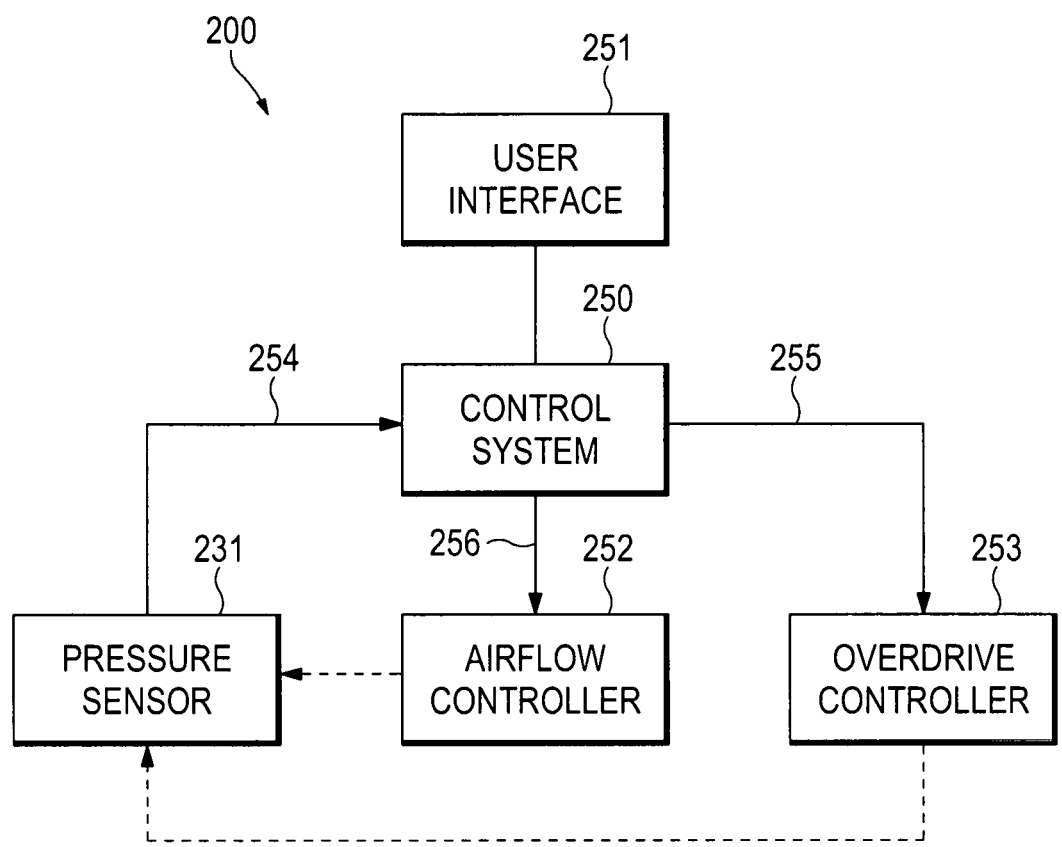
FIG. 2 is a functional block diagram of a system for testing integrated circuits, according to embodiments.
Figure 3:
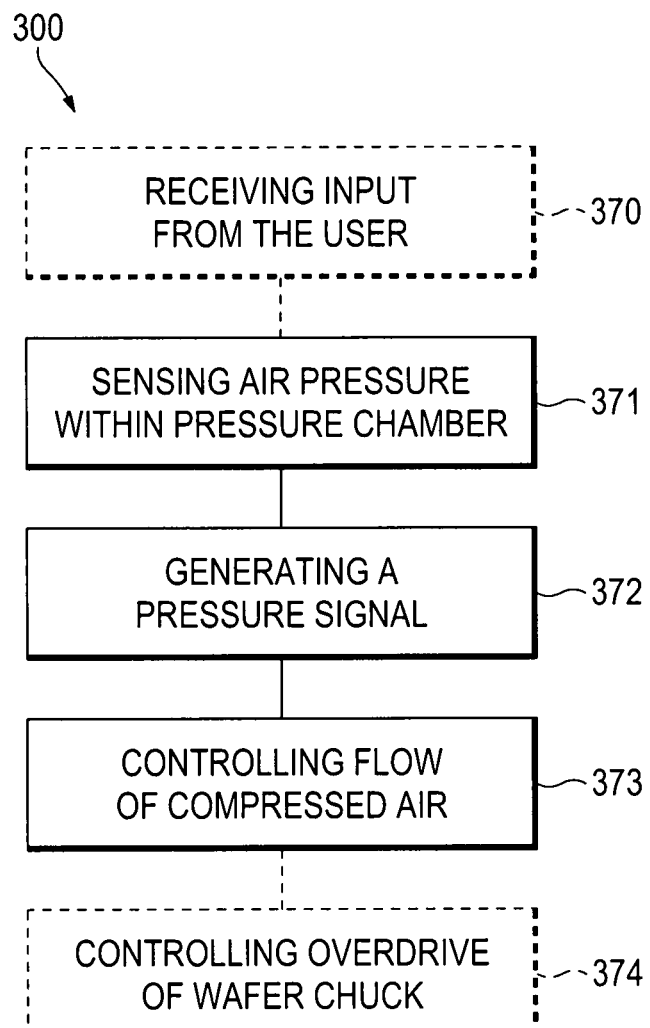
FIG. 3 is a flowchart showing a method of using a probe card to test an integrated circuit, according to embodiments.
Figure 4:
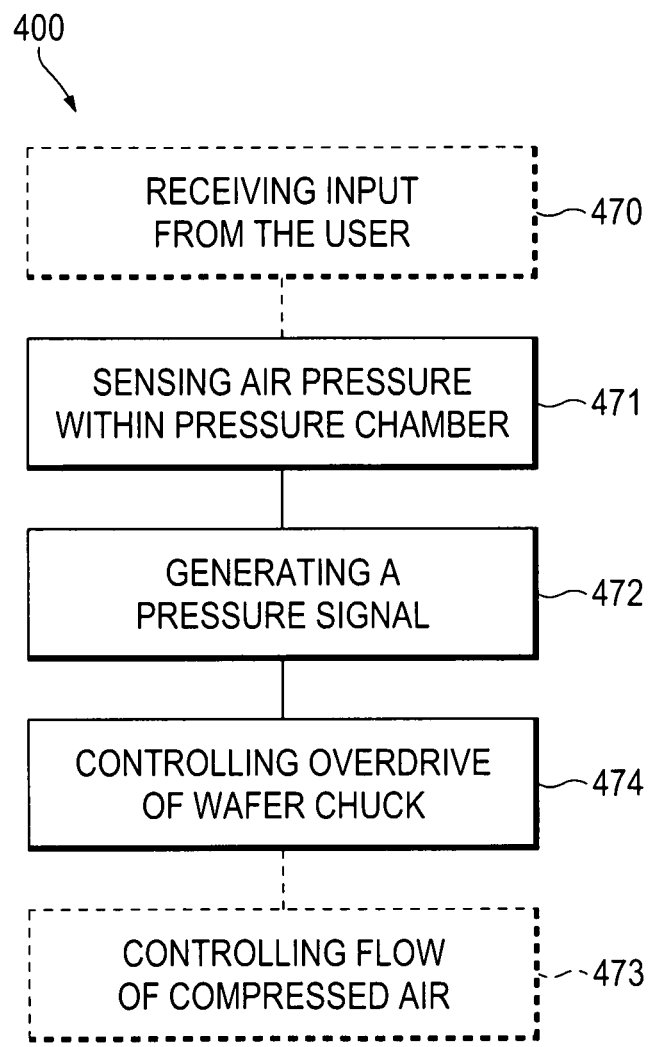
FIG. 4 is a flowchart showing a method of using a probe card to test an integrated circuit, according to embodiments.

In the Detailed Description that follows, reference numbers of the pattern 1xx are generally shown in FIGS. 1A-1C, while 2xx reference numbers are generally shown in FIG. 2. Likewise, 3xx reference numbers are generally shown in FIG. 3, and 4xx reference numbers are generally shown in FIG. 4.

DETAILED DESCRIPTION

As described herein, embodiments of the disclosed technology are directed to novel configurations of a probe card for testing integrated-circuit wafers. In embodiments, the probe needles are configured to deflect within the gap between the probe card and the integrated circuit under test within the elastic limit for the material of the probe needles. For example, the probe needles may have one or more bends, so that each probe needle has an L-shape, a flared L-shape, or another bent configuration. Also, embodiments allow feedback control of the gas pressure in the pressure chamber of the probe card. In such embodiments, a control system may allow for precise control of the gas pressure by controlling the position of the prober chuck with respect to the probe card, controlling the flow of gas into the pressure chamber, or both. The desired gas pressure may be set, for example, through a user interface.

FIG. 1A is a sectional, perspective view showing portions of a probe card according to embodiments of the disclosed technology. FIG. 1B is a front view of the probe card of FIG. 1A, and FIG. 1C is a detail view of a portion of the probe card of FIG. 1B. As illustrated in FIGS. 1A-1C, a system 100 for testing an integrated-circuit wafer 101 held by a wafer chuck 102 of a wafer prober may include a probe card 103. The probe card 103 may include a probe body 104, a probe needle 105, and an integrated-circuit board 106.

The probe body 104 encloses a pressure chamber 107 and is coupled to the integrated-circuit board 106. The probe body 104 includes a unitary sidewall 108 having a longitudinal centerline 109. As used in this disclosure, unitary means that the sidewall 108 is substantially in one piece. In particular, the unitary sidewall 108 is not in two or more pieces that move relative to each other during normal use, meaning that the unitary sidewall 108 provides a pressure chamber 107 having a fixed height. Thus, the unitary sidewall 108 does not telescope and avoids the problems and complexities in the prior art with respect to telescoping walls.

The probe body 104 of FIGS. 1A-1C also includes a first end cap 110 and an inlet passage 111. The first end cap 110 substantially closes a first end 112 of the probe body 104, except for an outlet passage 113 in the first end cap 110 that is configured to permit gas to escape the pressure chamber 107.

The probe needle 105 is within the pressure chamber 107 and is supported by the probe body 104 at a supported end 114 of the probe needle 105. The probe body 104 may include a probe-needle contact 135 to support the probe needle 105 and to electrically connect the probe needle 105 to a region outside of the pressure chamber 107, such as, for example, to the integrated-circuit board 106. Preferably, the probe-needle contact 135 passes hermetically through the unitary sidewall 108 of the probe body 104. A free end 115 of the probe needle 105, which is opposite the supported end 114, extends through the outlet passage 113 of the first end cap 110. The supported end 114 of the probe needle 105 may be separated from the free end 115 of the probe needle 105 by a first bend 116 in the probe needle 105.

As illustrated in FIGS. 1A-1C, the first bend 116 in the probe needle 105 has its center of curvature 117 located between the probe needle 105 and the longitudinal centerline 109 of the unitary sidewall 108. Thus, the probe needle 105 bends inward, toward the center of the pressure chamber 107, at the first bend 116. Preferably, the first bend 116 in the probe needle 105 has a bend angle 118 between about 150 degrees and about 30 degrees. More preferably, the bend angle 118 is between about 120 degrees and about 60 degrees. Even more preferably, the bend angle 118 is about 90 degrees. In embodiments where the bend angle 118 is about 90 degrees, the probe needle 105 can be described as being L-shaped in appearance. In FIG. 1C, the arrow extending from the center of curvature 117 to the first bend 116 indicates the approximate radius of the first bend 116.

In addition to the first bend 116 between the supported end 114 and the free end 115 of the probe needle 105, the probe needle 105 may have a second bend 119 in the free end 115 of the probe needle 105. The center of curvature 120 of the second bend 119 is located such that the probe needle 105 is between the center of curvature 120 and the longitudinal centerline 109 of the unitary sidewall 108. Thus, the probe needle 105 bends outward, away from the center of the pressure chamber 107, at the second bend 119. Preferably, the second bend 119 in the probe needle 105 has a bend angle 121 between about 225 degrees and about 45 degrees.

More preferably, the bend angle 121 is between about 180 degrees and about 90 degrees. Even more preferably, the bend angle 121 is about 135 degrees. In embodiments where the bend angle 118 of the first bend 116 is about 90 degrees and the bend angle 121 of the second bend 119 is about 135 degrees, the probe needle 105 can be described as having a flared L-shaped appearance. In FIG. 1C, the arrow extending from the center of curvature 120 to the second bend 119 indicates the approximate radius of the second bend 119.

In addition to the second bend 119, the probe needle 105 may also include a third bend 122 in the free end 115 of the probe needle 105. The third bend 122 is between the second bend 119 and the tip 123 of the probe needle 105. The center of curvature 124 of the third bend 122 is located such that the probe needle 105 is between the center of curvature 124 and the longitudinal centerline 109 of the unitary sidewall 108. Thus, the probe needle 105 bends outward, away from the center of the pressure chamber 107, at the third bend 122. In embodiments, the third bend 122 may have a bend angle 125 such that the probe needle 105, between the third bend 122 and the tip 123 of the probe needle 105, is substantially parallel to the longitudinal centerline 109 of the unitary sidewall 108. An example of such a bend angle 125 for the third bend 122 is shown in FIGS. 1A-1C. In FIG. 1C, the arrow extending from the center of curvature 124 to the third bend 122 indicates the approximate radius of the third bend 122.

The first end cap 110 may include a channel 126, such as a slit or notch in an interior surface of the first end cap 110. The first bend 116 in the probe needle 105 may be substantially within the channel 126. In such embodiments, the channel 126 may substantially keep the probe needle 105 in place when the tip 123 of the probe needle 105 is deflected during typical use. For example, in embodiments having a generally cylindrical probe body 104, such as the embodiment illustrated in FIGS. 1A-1C, the channel 126 may restrict or prevent movement of the probe needle 105 in the radial and tangential directions, while permitting the probe needle 105 to flex about the center of curvature 117 of the first bend 116.

The first end cap 110 may include an external surface 127 on a side of the first end cap 110 opposite the pressure chamber 107. The free end 115 of the probe needle 105 may extend longitudinally beyond the external surface 127 of the first end cap 110 during an unloaded condition when the free end 115 of the probe needle 105 is not contacting the integrated-circuit wafer under test 101. In other words, the free end 115 of the probe needle 105 may extend in a direction that is away from the pressure chamber 107 and is toward the integrated-circuit wafer under test 101, and this extension may stretch beyond an imaginary plane defined by the external surface 127 of the first end cap 110. Preferably, the extended length beyond the external surface 127 in the unloaded condition is between about 250 microns and about 50 microns. More preferably, the extended length in the unloaded condition is between about 200 microns and about 100 microns. Even more preferably, the extended length in the unloaded condition is about 150 microns. As known in the art, a micron is about 0.000039 inches. Thus, 150 microns is about 0.0059 inches.

Additionally, the free end 115 of the probe needle 105 may extend longitudinally beyond the external surface 127 of the first end cap 110 during a loaded condition and within the elastic limit for the material of the probe needle 105. The loaded condition is when the free end 115 of the probe needle 105 is contacting the integrated-circuit wafer under test 101. Preferably, the extended length in the loaded condition is less than the extended length in the unloaded condition. Thus, for example, if the extended length in the unloaded condition is about 150 microns, then the extended length in the loaded condition is preferably between about 150 microns and about zero microns. Also, preferably the extended length in the loaded condition is greater than zero microns, meaning that the external surface 127 of the first end cap 110 does not contact the wafer under test 101 in the loaded condition. In other words, in the loaded condition, there is preferably a gap between the external surface 127 of the first end cap 110 and the wafer under test 101.

The elastic limit of the probe needle 105 refers to the elastic limit of the materials that make up the probe needle 105. Those materials may be chosen such that the tip 123 of the probe needle 105 may be deflected by the disclosed amounts (such as, for example, 150 microns) without causing damage to the probe needle 105 through permanent deformation. Hence, for example, the probe needle 105 may be made from tungsten rhenium wire. In addition, each of the bends, particularly the first bend 116, allows the probe needle 105 to deflect between the loaded condition and the unloaded condition.

The inlet passage 111 is configured to introduce compressed gas into the pressure chamber 107. An inlet pressure fitting 128 may be coupled to or inserted into the inlet passage 111 to facilitate the transmission of compressed gas from a compressed gas source to the inlet passage 111. The compressed gas source may be, for example, a gas compressor. The gas may be, for example, air or nitrogen.

The probe body 104 of FIGS. 1A-1C may also include a second end cap 129 that substantially closes a second end 130 of the probe body 104. Accordingly, the pressure chamber 107 may be the volume between the first end cap 110, the second end cap 129, and the unitary sidewall 108 of the probe body 104.

As illustrated in FIGS. 1A-1C, the probe card 103 may also include a pressure sensor 131. The pressure sensor 131 is within the pressure chamber 107 and is configured to generate a pressure signal 254 that corresponds to a gas pressure sensed within the pressure chamber 107. Preferably, the pressure sensor 131 is configured to sense the gas pressure at the tip 123 of the probe needle 105 by, for example, positioning the pressure sensor 131 close to the tip, such as within about 5 mm from the tip 123. The pressure sensor 131 may include electronic leads 132 configured to carry the pressure signal 254 away from the pressure sensor 131 and to, for example, a control system 250. Preferably, the electronic leads 132 pass hermetically through the second end cap 129.

The probe card 103 may also include a first elastomeric seal 133, or o-ring, to seal between the first end cap 110 and the unitary sidewall 108, and a second elastomeric seal 134, or o-ring, to seal between the second end cap 129 and the unitary sidewall 108. The probe card 103 may also include a nut 136 for coupling the probe body 104 to the integrated-circuit board 106.

FIG. 2 is a functional block diagram showing portions of a system for testing integrated circuits, according to embodiments of the disclosed technology. As illustrated in FIG. 2, a system 200 may include a control system 250, a pressure sensor 231, a user interface 251, a gas-flow controller 252, and an overdrive controller 253.

The pressure sensor 231 of FIG. 2 may be the pressure sensor 131 of FIGS. 1A-1C, as described above. Accordingly, the pressure sensor 231 is configured to generate a pressure signal 254 that corresponds to a gas pressure sensed within the pressure chamber 107 of the probe card 103.

The control system 250 is configured to receive the pressure signal 254 from the pressure sensor 231 and to send a signal 255 to the overdrive controller 253, to send a signal 256 to the gas-flow controller 252, or to send both signals: a signal 255 to the overdrive controller 253 and a signal 256 to the gas-flow controller 252. The control system 250 may be any processor configured to perform the described tasks, and the control-system processor may be part of the probe card 103, within the wafer prober, or elsewhere.

The purpose of the signal 255 to the overdrive controller 253 is to control the overdrive of the wafer chuck 102 in response to the pressure signal 254. As that term is used in the art, "overdrive" typically refers to moving the wafer chuck 102 of the wafer prober toward or away from the probe card 103 in what is commonly called the Z-direction. Thus, the overdrive controller 253 may be any processor configured to provide instructions to the drive motor or other physical means for moving the wafer chuck 102. The overdrive controller 253 may be part of the system 200, or the overdrive controller 253 may be a separate device, external to the system, with which the control system 250 communicates.

Moving the wafer chuck 102 of the wafer prober toward the probe card 103 tends to reduce the gap between the external surface 127 of the first end cap 110 and the wafer under test 101, which is mounted to the wafer chuck 102. When the gap is reduced in width, the compressed gas is further restricted from exiting the pressure chamber 107. Accordingly, the gas pressure in the pressure chamber 107 will tend to be higher than if the gap were greater in width. Likewise, moving the wafer chuck 102 of the wafer prober away from the probe card 103 tends to increase the gap. Thus, the gas pressure in the pressure chamber 107 tends to drop because the compressed gas may more easily escape from the pressure chamber 107.

The purpose of the signal to the gas-flow controller 252 is to control the flow of compressed gas to the inlet passage 111 in response to the pressure signal 254. Thus, the gas-flow controller 252 may be any processor configured to provide instructions to an electronically-controlled valve or other physical means for regulating flow of gas to the inlet passage 111. The gas-flow controller 252 may be part of the system 200, or the gas-flow controller 252 may be a separate device, external to the system, with which the control system 250 communicates.

Increasing the flow of compressed gas to the inlet passage 111 will tend to increase the gas pressure within the pressure chamber 107. Likewise, decreasing the flow of compressed gas to the inlet passage 111 will tend to decrease the gas pressure within the pressure chamber 107.

The user interface 251, which may be a graphical user interface, is configured to allow a user to set certain parameters. For example, the user interface 251 may allow the user to specify a desired gas pressure for the pressure chamber 107. In some embodiments, instead of (or in addition to) allowing the user to set certain parameters, one or more parameters may be preset. For example, the desired gas pressure for the pressure chamber 107 may be preset, such as by programming the desired gas pressure into the control system 250. Other values that may be preset or set by the user through the user interface 251 include the accuracy of the pressure control (meaning the acceptable deviation, or tolerance, from the desired gas pressure), an initial gap distance (meaning the distance, in microns, between the external surface 127 of the first end cap 110 and the wafer under test 101 in the unloaded condition), the resolution of the gas control (meaning the desired step size of the gas-flow controller 252 in responding to the control system 250, such as, for example, increments that are 10% of the current flow rate in cubic feet per minute), and the step size of the gap control (meaning the desired step size of the overdrive controller 253 in responding to the control system 250, such as, for example, one-micron increments).

When the desired gas pressure is set by the user or is preset, the control system 250 may be further configured to control the overdrive and the flow of gas to maintain the desired gas pressure within the pressure chamber 107.

FIG. 3 is a flowchart, showing portions of a method of using a probe card, according to embodiments. As illustrated in FIG. 3, a method 300 of using a probe card, having a probe needle, to test an integrated circuit, may include: sensing 371, with a pressure sensor, gas pressure within a pressure chamber substantially enclosed by a probe body, the probe body comprising a unitary sidewall, an inlet passage, and an outlet passage, the probe needle being within the pressure chamber, supported by the probe body at a first end of the probe needle, and extending through the outlet passage at a second end of the probe needle; generating 372, by the pressure sensor, a pressure signal indicative of the sensed gas pressure; and continuously controlling 373, by a control system, a flow of compressed gas to the pressure chamber in response to the generated pressure signal.

Where the integrated circuit is held by a wafer chuck of a wafer prober, the method 300 may also include continuously controlling 374, by the control system, overdrive of the wafer chuck to position the wafer chuck relative to the probe body in response to the generated pressure signal.

The method 300 may also include receiving 370, at a user interface, input from a user indicating values of one or more desired parameters, the one or more desired parameters including a desired gas pressure for the pressure chamber, in which continuously controlling the flow of compressed gas to the pressure chamber further includes maintaining the desired gas pressure within the pressure chamber.

The method 300 may also include receiving 370, at a user interface, input from a user indicating values of one or more desired parameters, the one or more desired parameters including a distance between test points on the integrated circuit, in which continuously controlling the flow of compressed gas to the pressure chamber further includes maintaining a gas pressure within the pressure chamber sufficient to prevent dielectric breakdown between the test points while the integrated circuit is being tested. The gas pressure sufficient to prevent dielectric breakdown between the test points may be derived based on Paschen's law and a known test voltage to be applied between the two test points.

The pressure chamber, probe body, unitary sidewall, inlet passage, and an outlet passage of the method 300 may be as described above for FIGS. 1A-1C. The pressure sensor may be as described above for FIGS. 1 and 2. The control system may be as described above for FIG. 2.

FIG. 4 is a flowchart, showing portions of a method of using a probe card, according to embodiments. As illustrated in FIG. 4, a method 400 of using a probe card, having a probe needle, to test an integrated circuit held by a wafer chuck of a wafer prober, may include sensing 471, with a pressure sensor, gas pressure within a pressure chamber substantially enclosed by a probe body, the probe body comprising a unitary sidewall, an inlet passage, and an outlet passage, the probe needle being within the pressure chamber, supported by the probe body at a first end of the probe needle, and extending through the outlet passage at a second end of the probe needle; generating 472, by the pressure sensor, a pressure signal indicative of the sensed gas pressure; and continuously controlling 474, by the control system, overdrive of the wafer chuck to position the wafer chuck relative to the probe body in response to the generated pressure signal.

The method 400 may optionally include continuously controlling 473, by a control system, a flow of compressed gas to the pressure chamber in response to the generated pressure signal.

The method 400 may optionally include receiving 470, at a user interface, input from a user indicating values of one or more desired parameters, the one or more desired parameters including a desired gas pressure for the pressure chamber, in which continuously controlling the overdrive further includes maintaining the desired gas pressure within the pressure chamber.

The method 400 may also include receiving 470, at a user interface, input from a user indicating values of one or more desired parameters, the one or more desired parameters including a distance between test points on the integrated circuit, in which continuously controlling the overdrive further includes maintaining a gas pressure within the pressure chamber sufficient to prevent dielectric breakdown between the test points while the integrated circuit is being tested. The gas pressure sufficient to prevent dielectric breakdown between the test points may be derived based on Paschen's and a known test voltage to be applied between the two test points.

The pressure chamber, probe body, unitary sidewall, inlet passage, and an outlet passage of the method 400 may be as described above for FIGS. 1A-1C. The pressure sensor may be as described above for FIGS. 1 and 2. The control system and user interface may be as described above for FIG. 2.

EXAMPLES

Illustrative examples of the disclosed technologies are provided below. An embodiment of the technologies may include one or more, and any combination of, the examples described below.

Example 1 includes a testing system for testing an integrated-circuit wafer, the system comprising a probe card having: a probe body enclosing a pressure chamber, the probe body comprising a unitary sidewall having a longitudinal centerline, an inlet passage configured to introduce compressed gas into the pressure chamber, and a first end cap substantially closing a first end of the probe body, except for an outlet passage in the first end cap; and a probe needle within the pressure chamber and supported by the probe body at a supported end of the probe needle, a free end of the probe needle, opposite the supported end, extending through the outlet passage of the first end cap, the supported end of the probe needle being separated from the free end of the probe needle by a first bend in the probe needle, the first bend in the probe needle having a center of curvature located between the probe needle and the longitudinal centerline of the unitary sidewall.

Example 2 includes the testing system of Example 1, in which the first end cap includes a channel, the first bend in the probe needle being substantially within the channel.

Example 3 includes the testing system of any of Examples 1-2, in which the first bend in the probe needle has a bend angle of about ninety degrees.

Example 4 includes the testing system of any of Examples 1-3, in which the probe needle further comprises a second bend in the free end of the probe needle, the probe needle being between a center of curvature of the second bend and the longitudinal centerline of the unitary sidewall.

Example 5 includes the testing system of Example 4, in which the second bend in the probe needle has a bend angle of about 135 degrees.

Example 6 includes the testing system of Example 4, in which the probe needle further comprises a third bend in the free end of the probe needle, the third bend being between the second bend and a tip of the probe needle, the probe needle being between a center of curvature of the third bend and the longitudinal centerline of the unitary sidewall.

Example 7 includes the testing system of Example 6, in which the probe needle, between the third bend and the tip of the probe needle, is substantially parallel to the longitudinal centerline of the unitary sidewall.

Example 8 includes the testing system of any of Examples 1-7, in which the first end cap has an external surface on a side of the first end cap opposite the pressure chamber, in which a portion of the free end of the probe needle extends longitudinally beyond the external surface of the first end cap during an unloaded condition when the free end of the probe is not contacting an integrated-circuit wafer under test.

Example 9 includes the testing system of Example 8, in which the free end of the probe needle extends about 150 microns beyond the external surface of the first end cap during the unloaded condition.

Example 10 includes the testing system of Example 9, in which the free end of the probe needle extends longitudinally beyond the external surface of the first end cap by a non-zero length between about 150 microns and zero microns during a loaded condition when the free end of the probe is contacting an integrated-circuit wafer under test.

Example 11 includes the testing system of Example 8, in which the free end of the probe needle extends longitudinally beyond the external surface of the first end cap during a loaded condition when the free end of the probe is contacting an integrated-circuit wafer under test.

Example 12 includes the testing system of any of Examples 1-11, in which the probe card further comprises a pressure sensor within the pressure chamber and configured to generate a pressure signal corresponding to a gas pressure sensed within the pressure chamber.

Example 13 includes the testing system of Example 12, in which the probe body further comprises a second end cap substantially closing a second end of the probe body, in which the pressure sensor includes electronic leads configured to carry the pressure signal away from the pressure sensor, the electronic leads hermetically passing through the second end cap.

Example 14 includes the testing system of Example 12, further comprising a control system configured to receive the pressure signal from the pressure sensor and to control overdrive of a wafer chuck and flow of compressed gas to the inlet passage in response to the pressure signal.

Example 15 includes the testing system of Example 14, in which the control system includes a user interface configured to allow a user to set a desired gas pressure for the pressure chamber, in which the control system is further configured to control the overdrive and the flow of gas to maintain the desired gas pressure within the pressure chamber.

Example 16 includes a method of using a probe card, having a probe needle, to test an integrated circuit, the method comprising: sensing, with a pressure sensor, gas pressure within a pressure chamber substantially enclosed by a probe body, the probe body comprising a unitary sidewall, an inlet passage, and an outlet passage, the probe needle being within the pressure chamber, supported by the probe body at a first end of the probe needle, and extending through the outlet passage at a second end of the probe needle; generating, by the pressure sensor, a pressure signal indicative of the sensed gas pressure; and continuously controlling, by a control system, a flow of compressed gas to the pressure chamber in response to the generated pressure signal.

Example 17 includes the method of Example 16, in which the integrated circuit is held by a wafer chuck of a wafer prober, the method further comprising continuously controlling, by the control system, overdrive of the wafer chuck to position the wafer chuck relative to the probe body in response to the generated pressure signal.

Example 18 includes the method of any of Examples 16-17, further comprising receiving, at a user interface, input from a user indicating values of one or more desired parameters, the one or more desired parameters including a desired gas pressure for the pressure chamber, in which continuously controlling the flow of compressed gas to the pressure chamber further includes maintaining the desired gas pressure within the pressure chamber.

Example 19 includes the method of any of Examples 16-17, further comprising receiving, at a user interface, input from a user indicating values of one or more desired parameters, the one or more desired parameters including a distance between test points on the integrated circuit, in which continuously controlling the flow of compressed gas to the pressure chamber further includes maintaining a gas pressure within the pressure chamber sufficient to prevent dielectric breakdown between the test points while the integrated circuit is being tested.

Example 20 includes a method of using a probe card, having a probe needle, to test an integrated circuit held by a wafer chuck of a wafer prober, the method comprising: sensing, with a pressure sensor, gas pressure within a pressure chamber substantially enclosed by a probe body, the probe body comprising a unitary sidewall, an inlet passage, and an outlet passage, the probe needle being within the pressure chamber, supported by the probe body at a first end of the probe needle, and extending through the outlet passage at a second end of the probe needle; generating, by the pressure sensor, a pressure signal indicative of the sensed gas pressure; and continuously controlling, by the control system, overdrive of the wafer chuck to position the wafer chuck relative to the probe body in response to the generated pressure signal.

Example 21 includes the method of Example 20, further comprising receiving, at a user interface, input from a user indicating values of one or more desired parameters, the one or more desired parameters including a desired gas pressure for the pressure chamber, in which the continuous control of the overdrive further includes maintaining the desired gas pressure within the pressure chamber.

Example 22 includes the method of any of Examples 20-21, further comprising receiving, at a user interface, input from a user indicating values of one or more desired parameters, the one or more desired parameters including a distance between test points on the integrated circuit, in which continuously controlling the overdrive further includes maintaining a gas pressure within the pressure chamber sufficient to prevent dielectric breakdown between the test points while the integrated circuit is being tested.

Embodiments or portions of the disclosed technologies may operate on a particularly created hardware, on firmware, digital signal processors, or on a specially programmed general-purpose computer including a processor operating according to programmed instructions. The terms "controller" or "processor" as used herein are intended to include microprocessors, microcomputers, ASICs, and dedicated hardware controllers. One or more aspects of the disclosed technology may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the disclosed technology, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments of the disclosed technology have been illustrated and described for purposes of illustration, it will be understood that various modifications may be made without departing from the spirit and scope of the disclosed technology. Accordingly, the invention should not be limited except as by the appended claims.

The invention claimed is:

1. A system for testing an integrated-circuit wafer, the system comprising a probe card having:
 a probe body enclosing a pressure chamber, the probe body comprising:
  a unitary sidewall having a longitudinal centerline,
  an inlet passage configured to introduce compressed gas into the pressure chamber, and
  a first end cap substantially closing a first end of the probe body, except for an outlet passage in the first end cap, and;

a probe needle within the pressure chamber and supported by the probe body at a supported end of the probe needle, a free end of the probe needle, opposite the supported end, extending through the outlet passage of the first end cap, the supported end of the probe needle being separated from the free end of the probe needle by a first bend in the probe needle, the first bend in the probe needle having a center of curvature located between the probe needle and the longitudinal centerline of the unitary sidewall.

2. The testing system of claim 1, in which the first end cap includes a channel, the first bend in the probe needle being substantially within the channel.

3. The testing system of claim 1, in which the first bend in the probe needle has a bend angle of about ninety degrees.

4. The testing system of claim 1, in which the probe needle further comprises a second bend in the free end of the probe needle, the probe needle being between a center of curvature of the second bend and the longitudinal centerline of the unitary sidewall.

5. The testing system of claim 4, in which the second bend in the probe needle has a bend angle of about 135 degrees.

6. The testing system of claim 4, in which the probe needle further comprises a third bend in the free end of the probe needle, the third bend being between the second bend and a tip of the probe needle, the probe needle being between a center of curvature of the third bend and the longitudinal centerline of the unitary sidewall.

7. The testing system of claim 6, in which the probe needle, between the third bend and the tip of the probe needle, is substantially parallel to the longitudinal centerline of the unitary sidewall.

8. The testing system of claim 1, in which the first end cap has an external surface on a side of the first end cap opposite the pressure chamber, in which a portion of the free end of the probe needle extends longitudinally beyond the external surface of the first end cap during an unloaded condition, defined as when the free end of the probe is not contacting an integrated-circuit wafer under test.

9. The testing system of claim 8, in which the free end of the probe needle extends about 150 microns beyond the external surface of the first end cap during the unloaded condition.

10. The testing system of claim 9, in which the free end of the probe needle extends longitudinally beyond the external surface of the first end cap by a non-zero length between about 150 microns and zero microns during a loaded condition, defined as when the free end of the probe is contacting an integrated-circuit wafer under test.

11. The testing system of claim 8, in which the free end of the probe needle extends longitudinally beyond the external surface of the first end cap during a loaded condition, defined as when the free end of the probe is contacting an integrated-circuit wafer under test.

12. The testing system of claim 1, in which the probe card further comprises a pressure sensor within the pressure chamber and configured to generate a pressure signal corresponding to a gas pressure sensed within the pressure chamber.

13. The testing system of claim 12, in which the probe body further comprises a second end cap substantially closing a second end of the probe body, in which the pressure sensor includes electronic leads configured to carry the pressure signal away from the pressure sensor, the electronic leads hermetically passing through the second end cap.

14. The testing system of claim 12, further comprising a control system configured to receive the pressure signal from the pressure sensor and to control overdrive of a wafer chuck and flow of compressed gas to the inlet passage in response to the pressure signal.

15. The testing system of claim 14, in which the control system includes a user interface configured to allow a user to set a desired gas pressure for the pressure chamber, in which the control system is further configured to control the overdrive and the flow of compressed gas to maintain the desired gas pressure within the pressure chamber.

16. A method of using a probe card, having a probe needle, to test an integrated circuit, the method comprising:
sensing, with a pressure sensor, gas pressure within a pressure chamber substantially enclosed by a probe body, the probe body comprising a unitary sidewall, an inlet passage, and an outlet passage, the probe needle being within the pressure chamber, supported by the probe body at a first end of the probe needle, and extending through the outlet passage at a second end of the probe needle, a supported end of the probe needle being separated from a free end of the probe needle by a first bend in the probe needle, the first bend in the probe needle having a center of curvature located between the probe needle and a longitudinal centerline of the unitary sidewall;
generating, by the pressure sensor, a pressure signal indicative of the sensed gas pressure; and
continuously controlling, by a control system, a flow of compressed gas to the pressure chamber in response to the generated pressure signal.

17. The method of claim 16, in which the integrated circuit is held by a wafer chuck of a wafer prober, the method further comprising continuously controlling, by the control system, overdrive of the wafer chuck to position the wafer chuck relative to the probe body in response to the generated pressure signal.

18. The method of claim 16, further comprising receiving, at a user interface, input from a user indicating values of one or more desired parameters, the one or more desired parameters including a desired gas pressure for the pressure chamber, in which continuously controlling the flow of compressed gas to the pressure chamber further includes maintaining the desired gas pressure within the pressure chamber.

19. The method of claim 16, further comprising receiving, at a user interface, input from a user indicating values of one or more desired parameters, the one or more desired parameters including a distance between test points on the integrated circuit, in which continuously controlling the flow of compressed gas to the pressure chamber further includes maintaining a gas pressure within the pressure chamber sufficient to prevent dielectric breakdown between the test points while the integrated circuit is being tested.

20. A method of using a probe card, having a probe needle, to test an integrated circuit held by a wafer chuck of a wafer prober, the method comprising:
sensing, with a pressure sensor, gas pressure within a pressure chamber substantially enclosed by a probe body, the probe body comprising a unitary sidewall, an inlet passage, and an outlet passage, the probe needle being within the pressure chamber, supported by the probe body at a first end of the probe needle, and extending through the outlet passage at a second end of the probe needle, a supported end of the probe needle being separated from a free end of the robe needle by a first bend in the probe needle, the first bend in the probe needle having a center of curvature located between the probe needle and a longitudinal centerline of the unitary sidewall;

generating, by the pressure sensor, a pressure signal indicative of the sensed gas pressure; and continuously controlling, by the control system, overdrive of the wafer chuck to position the wafer chuck relative to the probe body in response to the generated pressure signal.

21. The method of claim 20, further comprising receiving, at a user interface, input from a user indicating values of one or more desired parameters, the one or more desired parameters including a desired gas pressure for the pressure chamber, in which the continuous control of the overdrive further includes maintaining the desired gas pressure within the pressure chamber.

22. The method of claim 20, further comprising receiving, at a user interface, input from a user indicating values of one or more desired parameters, the one or more desired parameters including a distance between test points on the integrated circuit, in which continuously controlling the overdrive further includes maintaining a gas pressure within the pressure chamber sufficient to prevent dielectric breakdown between the test points while the integrated circuit is being tested.

* * * * *